(12) United States Patent
Hsieh et al.

(10) Patent No.: US 8,237,477 B1
(45) Date of Patent: Aug. 7, 2012

(54) PROGRAMMABLE CLOCK GENERATOR USED IN DYNAMIC-VOLTAGE-AND-FREQUENCY-SCALING (DVFS) OPERATED IN SUB- AND NEAR-THRESHOLD REGION

(75) Inventors: Chung-Ying Hsieh, Changhua (TW); Ming-Hung Chang, Tainan (TW); Wei Hwang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/067,232

(22) Filed: May 18, 2011

(30) Foreign Application Priority Data

Mar. 7, 2011 (TW) .................................. 100107526

(51) Int. Cl.
*H03L 7/06* (2006.01)
(52) U.S. Cl. ......... 327/158; 327/149; 327/151; 327/160
(58) Field of Classification Search .................. 327/149, 327/151, 153, 158, 160, 161
See application file for complete search history.

(56) References Cited

U.S. PATENT DOCUMENTS

| | | | | |
|---|---|---|---|---|
| 5,828,250 | A  * | 10/1998 | Konno | 327/116 |
| 6,208,183 | B1 * | 3/2001  | Li et al. | 327/161 |
| 7,095,261 | B2 * | 8/2006  | Drexler et al. | 327/158 |
| 7,999,585 | B2 * | 8/2011  | Kapusta et al. | 327/158 |

* cited by examiner

*Primary Examiner* — Patrick O'Neill
(74) *Attorney, Agent, or Firm* — Bacon & Thomas, PLLC

(57) ABSTRACT

A programmable clock generator, which is used in dynamic-voltage-and-frequency-scaling (DVFS) operated in Sub- and Near-Threshold region. The programmable clock generator includes first pulse generating unit and a pulse multiplier. A first counter is configured to generate a first counting signal, so as to control the phase detector comparing the phase difference between a first pulse signal and a second pulse signal. A first control signal is transmitted by a control unit in accordance with a phase difference signal, and the phase of the second pulse signal is adjusted by a lock-in delay unit, so that a predetermined phase is generated between the first pulse signal and the second pulse signal. The PVT variation may be compensated by the programmable clock generator during the sub threshold region. Therefore, the period of reference clock is in the locking range of lock-in delay line.

7 Claims, 9 Drawing Sheets

| F1 | M1 | M2 | f4 / f1 |
|---|---|---|---|
| 000 | 1 | 8 | 0.125 |
| 001 | 1 | 6 | 0.167 |
| 010 | 1 | 4 | 0.250 |
| 011 | 1 | 2 | 0.5 |
| 100 | 8 | 8 | 1 |
| 101 | 8 | 6 | 1.333 |
| 110 | 8 | 4 | 2 |
| 111 | 8 | 2 | 4 |

Figure 2

PROGRAMMABLE CLOCK GENERATOR USED IN DYNAMIC-VOLTAGE-AND-FREQUENCY-SCALING (DVFS) OPERATED IN SUB- AND NEAR- THRESHOLD REGION

BACKGROUND OF THE INVENTION

1. Field of the Invention

The invention relates to a programmable clock generator, more particularly to a programmable clock generator used in dynamic-voltage-and-frequency-scaling (DVFS) operated in Sub- and Near-Threshold region.

2. Description of the Prior Art

The wireless behavior sensor network technology has already occupied an important influence in life gradually. Under current energy conservation and environmental protection consciousness mainstream, all big technological factories study the methods for reducing energy consumption, and also try to lengthen the working time of the apparatus at the same time. Thus, the design of extremely low voltage circuit becomes very important in order to reach the technology of extremely low power consumption. Therefore, how to operate the circuit near sub-threshold region has become a very important issue.

Due to the advanced progress of Complementary Metal-Oxide-Semiconductor (CMOS) process, the thickness of gate-oxide layer becomes much thinner in the transistor. It can only bear much less voltage, including the gate-source voltage (Vgs) and the gate-drain voltage (Vgd). In order to increase the working speed of the circuit, and reduce the energy consumption, the working voltage is also reduced for the design of recent integrated circuit. In the conventional traditional technology, in order to reduce the power consumption of circuit, it is often necessary to reduce the operation voltage and frequency of circuit. Under low voltage, the power consumption of apparatus can be reduced greatly, because the dynamic power consumption is reduced by two orders. However, under extremely low voltage, the circuit is influenced by the variation of process, voltage and temperature greatly, so that the frequency locking range of clock generator will be changed. When the frequency locking range is unable to cover the reference frequency, the clock generator might be unable to be operated due to the functional error of circuit.

Thus, it is necessary to develop a programmable clock generator, which is able to be operated under extremely low voltage in order to compensate the variation of process, voltage and temperature.

SUMMARY OF THE INVENTION

The invention provides a programmable clock generator having the dynamic frequency lock, which is used to adjust the frequency locking offset under extremely low voltage due to the variation of process, voltage and temperature. Therefore, the invention provides a programmable clock generator, which is used in dynamic-voltage-and-frequency-scaling (DVFS) operated in Sub- and Near-Threshold region. The programmable clock generator includes a first pulse generating unit and a pulse multiplier. The first pulse generating unit is used to receive an input signal owning an input frequency in order to generate a first pulse signal owning a first phase and a first frequency.

The pulse multiplier connects the first pulse generating unit. This pulse multiplier includes the phase detector, control unit, multiplexer, lock-in delay unit, compensation unit, second pulse generating unit and first counting unit. The phase detector connects the first pulse generating unit and receives the first pulse signal in order to generate a phase difference signal. The control unit connects the phase detector in order to generate a first control signal and a selection signal. The multiplexer connects the control unit, the first pulse generating unit and the second pulse generating unit, in order to receive the selection signal, the first pulse signal and the second pulse signal. Among these, the control unit controls the multiplexer in accordance with the selection signal in order to transmit the first pulse signal or the second pulse signal.

The lock-in delay unit connects the control unit and the multiplexer. The lock-in delay unit is used to delay the signals received by the multiplexer, so that a first predetermined phase is generated between the first pulse signal and the second pulse signal. The compensation unit connects the lock-in delay unit in order to compensate a second predetermined phase generated between the first pulse signal and the second pulse signal. The second pulse generating unit connects the compensation unit and the phase detector in order to generate a second pulse signal with a second phase and a second frequency. The first counting unit connects the second pulse generating unit, the control unit and the phase detector. The first counting unit is used to calculate a first counting value, and transmit the first counting signal to the phase detector and the control unit.

In the embodiment of the invention, when the first counting value calculated by the first counting unit is 8, the first counting unit will generate a first counting signal to control the phase detector comparing the phase difference between a first pulse signal and a second pulse signal in order to transmit the phase difference signal to the control unit. The control unit transmits the first control signal to the lock-in delay unit in accordance with the phase difference signal, and controls the lock-in delay unit to adjust the phase of the second pulse generating signal, so, that a predetermined phase is generated between the first pulse signal and the second pulse signal.

Therefore, the programmable clock generator provided by the invention can be operated in Sub- and Near-Threshold region in order to compensate the variation of process, voltage and temperature, so that the pulse generator can lock the reference frequency. In addition, the invention realizes a process, voltage, temperature compensation unit, which is used to lock the range of pulse generator.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 is the relation table of frequency selection signal, output signal and input signal;

DESCRIPTION OF THE PREFERRED EMBODIMENT

The direction of the invention explores a semiconductor light emitting device here. In order to understand the invention thoroughly, the structure and steps of semiconductor light emitting device will be The following embodiment is used to describe the applications of the invention. The advantages and functions of the invention can be understood easily. Except these detailed description, the invention can also be widely implemented in other embodiments. And it is not intended that the scope of the invention be limited to the description as set forth herein, which can be changed and modified.

Figure 1:
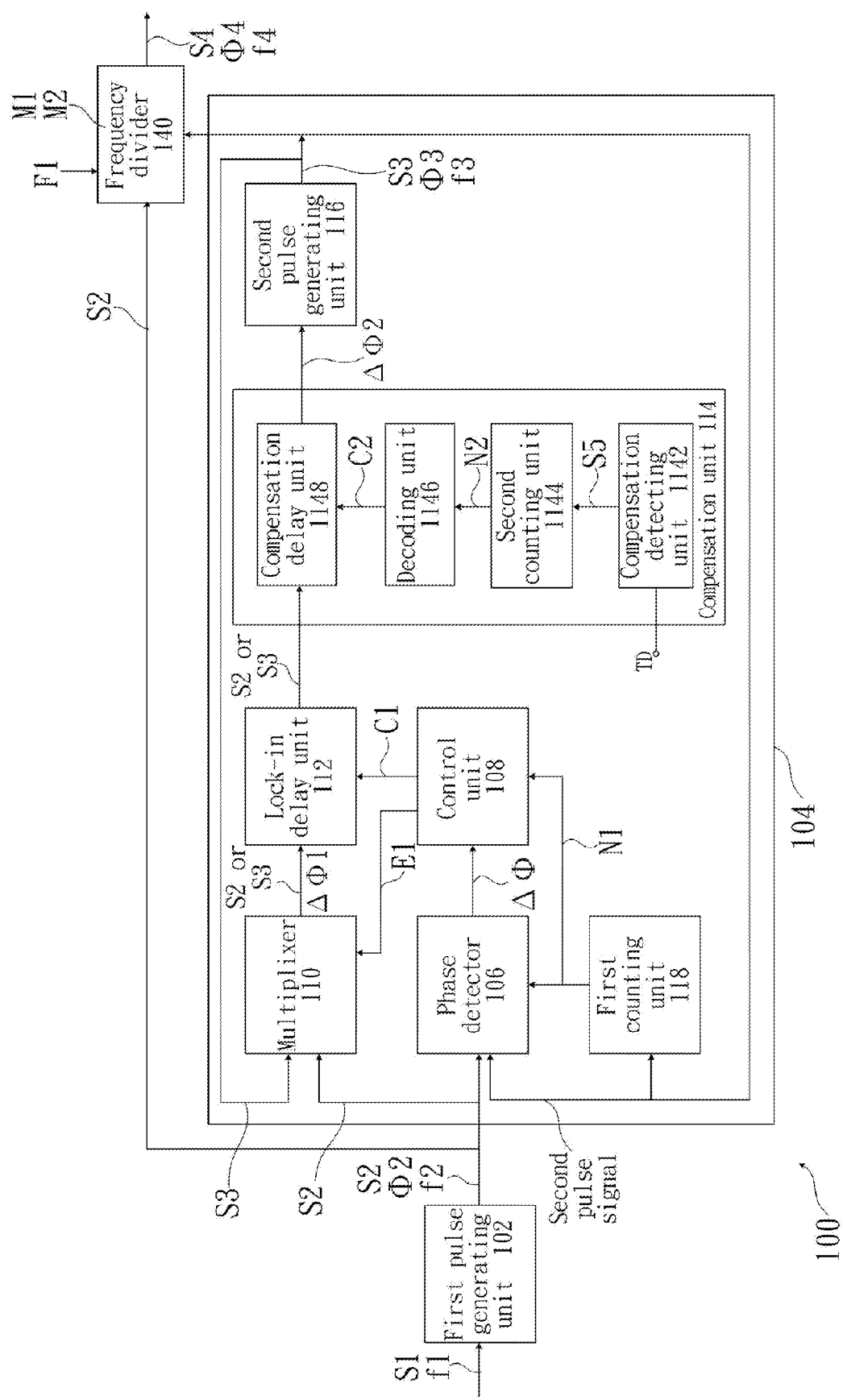
FIG. 1 is a diagram illustrating the block diagram for a programmable clock generator of the invention.

Referring to FIG. 1, the block diagram for a programmable clock generator of the invention is shown. The invention provides a programmable clock generator 100, which is used in Dynamic Voltage and Frequency Scaling system (DVFS system) operated in Sub- and Near-Threshold region. The programmable clock generator 100 includes a first pulse generating unit 102 and a pulse multiplier 104. Among these, an input signal S1 with an input frequency f1 is inputted into the first pulse generating unit 102 in order to generate a first pulse signal S2. The first pulse signal S2 includes a first phase $\Phi 2$ and a first frequency f2, wherein the first frequency f2 is equivalent to the input frequency f1. The pulse multiplier 104 connects the first pulse generating unit 102.

In the embodiment of FIG. 1, the pulse multiplier 104 includes the phase detector 106, control unit 108, multiplexer 110, lock-in delay unit 112, compensation unit 114, second pulse generating unit 116, and first counting unit 118. Among them, the phase detector 106 connects the first pulse generating unit 102 and receives the first pulse signal S2, in order to generate a phase difference signal $\Delta\Phi$. The control unit 108 connects the phase detector 106. The control unit 108 is used to generate a first control signal C1 and a selection signal E1. The multiplexer 110 connects the control unit 108, the first pulse generating unit 102, and the second pulse generating unit 116. Meantime, the multiplexer is used to receive the selection signal, the first pulse signal E1, the first pulse signal S2, and the second pulse signal S3. Among them, the control unit 108 controls the multiplexer 110 in accordance with the selection signal E1, in order to transmit the first pulse signal S2 or the second pulse signal S3.

Referring also to FIG. 1, the lock-in delay unit 112 connects the control unit 108 and the multiplexer 110. The lock-in delay unit 112 is used to delay a predetermined phase $\Delta\Phi 1$ generated between the first pulse signal S2 and the second pulse signal S3 received by the multiplexer. The compensation unit 114 connects the lock-in delay unit 112, in order to compensate a second predetermined phase $\Delta\Phi 2$ generated between the first pulse signal S2 and the second pulse signal S3. The second pulse generating unit 116 connects the compensation unit 114 and the phase detector 106 in order to generate a second pulse signal S3 with a second phase $\Phi 3$ and a second frequency f3. The first counting unit 118 connects the second pulse generating unit 116, the control unit 108 and the phase detector 106. The first counting unit 118 is used to calculate a first counting value, and transmit the first counting signal N1 to the phase detector 106 and the control unit 108. It has to demonstrate that the compensation unit 114 includes a process, voltage, temperature compensation unit, which is used to compensate the second predetermined phase generated between the first pulse signal and the second pulse signal due to the variation of process, voltage and temperature.

In the embodiment of FIG. 1, when the first counting value calculated by the first counting unit 118 is 8, the first counting unit 118 will generate a first counting signal N1 to control the phase detector 106 comparing the phase difference between a first pulse signal S2 and a second pulse signal S3, in order to transmit the phase difference signal $\Delta\Phi$ to the control unit 108. The control unit 108 transmits the first control signal C1 to the lock-in delay unit 112 in accordance with the phase difference signal $\Delta\Phi$, and controls the lock-in delay unit 112 to adjust the phase of the second pulse generating signal S3, so that a predetermined phase is generated between the first pulse signal S2 and the second pulse signal S3. In this embodiment, the second frequency f3 of the second pulse signal S3 is 8 times of the first frequency f2.

In another embodiment, referring to FIG. 1 and FIG. 2, FIG. 2 is the relation table of frequency selection signal, output signal S4 and input signal. The programmable clock generator 100 further includes a frequency divider 140. The frequency divider 140 connects the first pulse generating unit 102, the second pulse generating unit 116, the phase detector 106 and the counting unit 118. The frequency divider 140 includes a first parameter M1 and a second parameter M2. The frequency divider 140 is used to output the output signal S4. Among these, the output signal S4 includes an output frequency f4. The first parameter M1 includes 1 and 8. The second parameter M2 includes 2, 4, 6 and 8. The output frequency f4 is divided by the input frequency f1 equals to the first parameter M1 is divided by the second parameter M2, which means M1/M2=f4/f1. From the embodiment, it is known that the invention provided a programmable clock generator 100, which can be operated in Sub- and Near-Threshold region. Thus, the output frequency f4 for the output signal S4 of this programmable pulse generator 100 is ⅛ to 4 times of the input frequency f1 of the input signal S1, which is controlled by the input frequency selection signal F1, as shown in FIG. 2.

In the embodiment of FIG. 2, in order to generate the output frequency f4 of the output signal S4 as 8 times of the input frequency f1 of the input signal S1, the invention employs a circulating scheme, let every first pulse signal S2 enters the circulating route and circulates for 8 times. This circulating route is determined by the selection signal E1. Referring to FIG. 1, when the value of selection signal E1 is 1, the selection signal E1 will control the multiplexer 110, and let the first pulse signal S2 enters the lock-in delay unit 112. When the value of selection signal E1 is not 1, the circulating route will be created. The first counting unit 118 is used to count the times for the counting signal passing through the circulating route, and the lock-in delay unit 106 and control unit 108 will be notified whether first counting value equals to 8 through the first counting signal N1. When the first counting value equals to 8, the first counting unit 118 will transmit the first counting signal N1 to control the phase detector 106 comparing the output phase $\Phi 4$ of output signal S$ and phase $\Phi 2$ of first pulse signal S2. The control unit 108 will revise the phase difference signal $\Delta\Phi$ of the phase detector 106 and change the value of the first control signal C1 in accordance with the comparison result of the phase detector 106, such as phase lead or phase lag.

In the embodiment of FIG. 1, the compensation unit 114 further includes a compensation detecting unit 1142, a second counting unit 1144, a decoding unit 1146, and a compensation delay unit 1148. Among these, the compensation detecting unit 1142 is used to receive the reference pulse signal Td, and output the third pulse signal S5. The second counting unit 1144 connects the compensation detecting unit 1142. The second counting unit 1144 counts the third pulse signal S5 to obtain the second counting value, and generate the second counting signal N2 in accordance with the second counting value. The decoding unit 1146 connects the second counting unit 1144. The decoding unit 1146 receives the second counting signal N2 and decodes it to generate a second control signal C2. The compensation delay unit 1148 connects the decoding unit 1146, the lock-in delay unit 112 and the second pulse generating unit 116. The compensation delay unit 1148 receives the second control signal C2. Among these, the second control signal C2 controls the compensation delay unit 1148 in order to compensate a second predetermined phase ΔΦ2 generated between the first pulse signal S2 and the second pulse signal S3, so that the first pulse signal S2 or the second pulse signal S3 may fall in the locking range of the programmable clock generator.

Referring to FIG. 1, the structure of lock-in delay unit 112 and compensation unit 114 is the lattice delay line, which is composed of NAND gate. It has to demonstrate that the lock-in delay unit includes a lock-in delay line. The compensation unit 1148 includes a process, voltage and temperature (PVT) compensation delay line.

Figure 3:
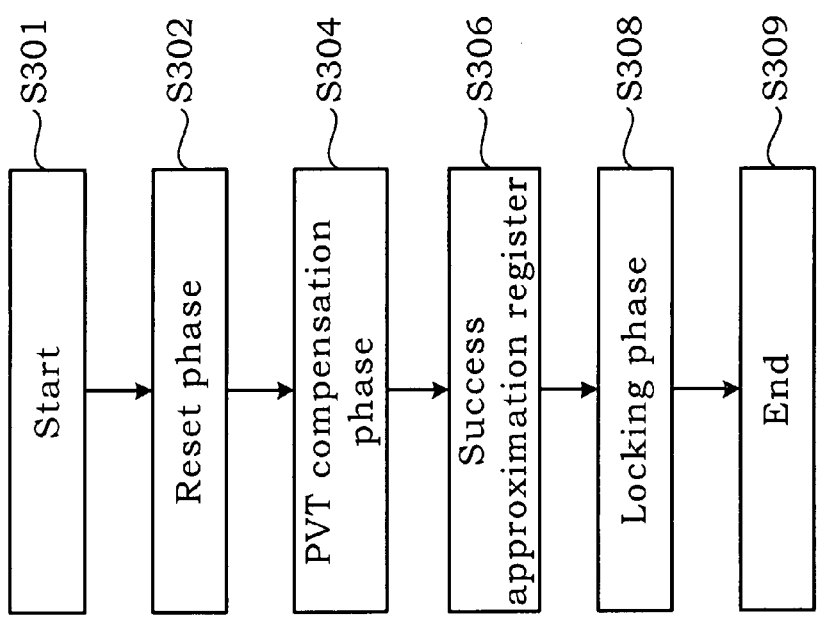
FIG. 3 is a flow diagram illustrating the phase compensation method of a preferred embodiment of the invention.

Referring to FIG. 3, the flow diagram for the phase compensation method of a preferred embodiment of the invention is illustrated. In this compensation method, the first step is the reset step S302. Because the operation voltage range is falling in the Sub- and Near-Threshold region, the influence of process, voltage and temperature variation is relatively severe compared to the super-threshold region, so that the lock-in delay unit 112 may have a very big delay. Thus, the compensation unit 114 in the programmable clock generator 100 will mainly compensate the process, voltage and temperature, in order to provide suitable delay to the lock-in delay unit 112, as shown in step S304. Then, the control unit 108 employs the binary search algorithm to achieve the success approximation register (SAR), and changes the first control signal C in accordance with the comparison result of the phase detector 106, such as phase lead or phase lag. The phase of input signal S1 will fall in the locking range of lock-in delay unit 112 through the success approximation register (SAR), as shown in step S306. Finally, the programmable clock generator 100 locks the phase into the locking state, as shown in step S308, wherein the pulse of output signal S4 will be multiplied or divided by a frequency. In the feedback loop from the output to the phase detector 106 and the control unit 108, the first control signal C1 still maintains in constant. The control unit 108 will use the first counting unit 118 to add or minus 1 to the first control signal C1 to trace its phase every time. Even under the variation of voltage and temperature, assure the programmable clock generator 100 is in a closed feedback loop, so as to lock the pulse.

Figure 4A:
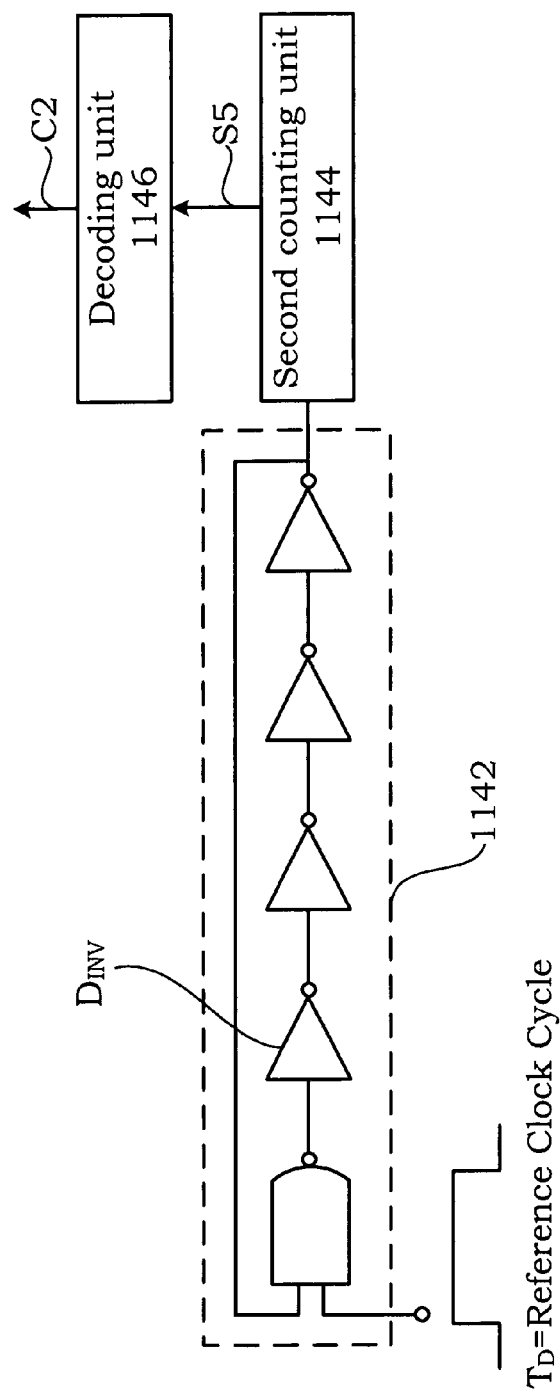
FIG. 4A is the circuit for the compensation detecting unit of a preferred embodiment of the programmable clock generator provided by the invention.
Figure 4B:
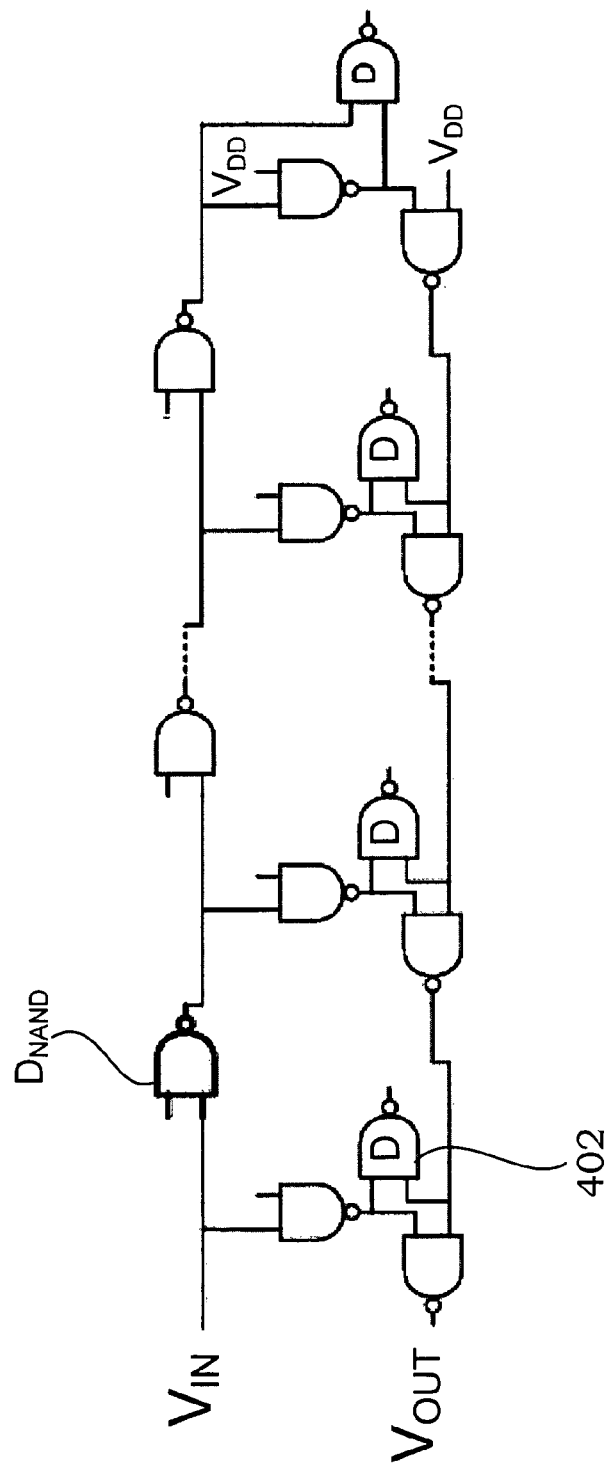
FIG. 4B is the circuit for the compensation delay unit of a preferred embodiment of the programmable clock generator provided by the invention.
Figure 5A:
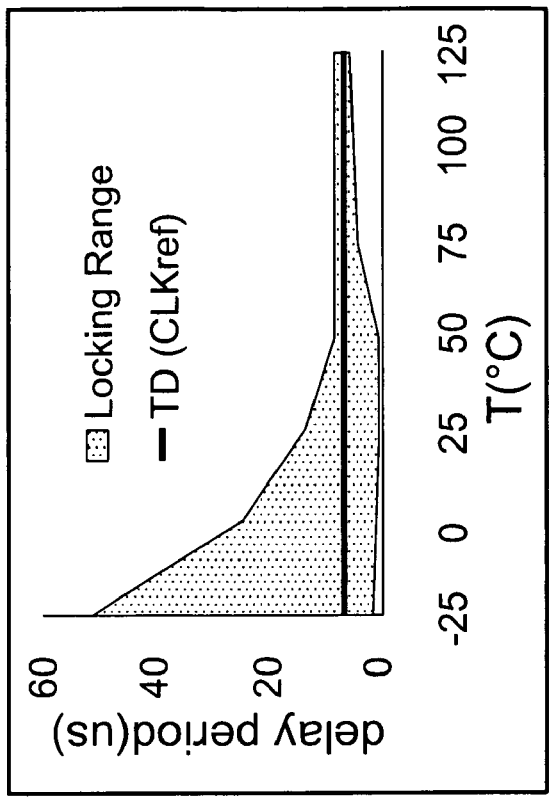
FIG. 5A, FIG. 5B, FIG. 5C, and FIG. 5D illustrate the locking range of a programmable clock generator of another preferred embodiment after PVT compensation at 0.2V TT, 0.2V FF, 0.5V TT and 0.5V FF.
Figure 5A:
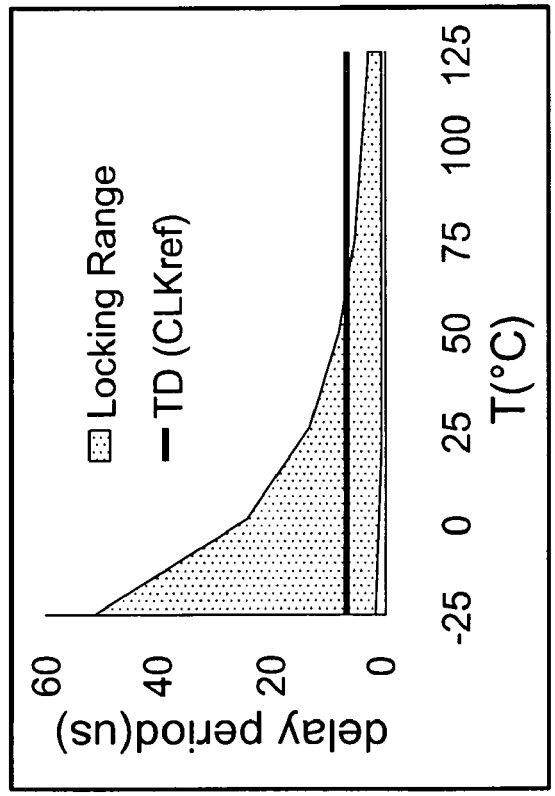
Figure 5B:
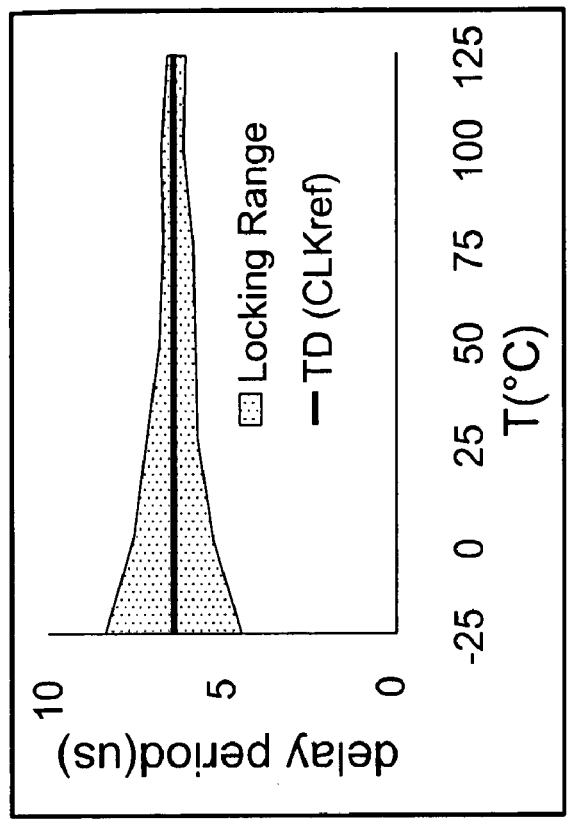
Figure 5B:
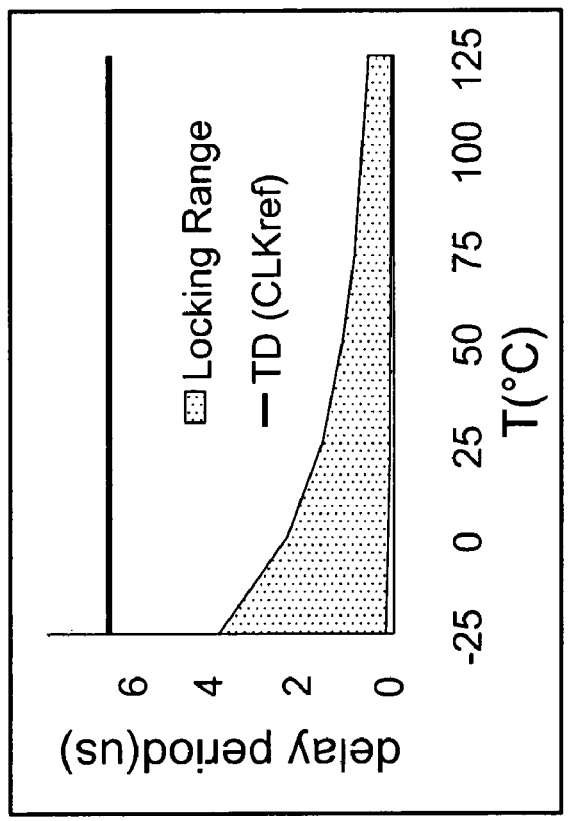
Figure 5C:
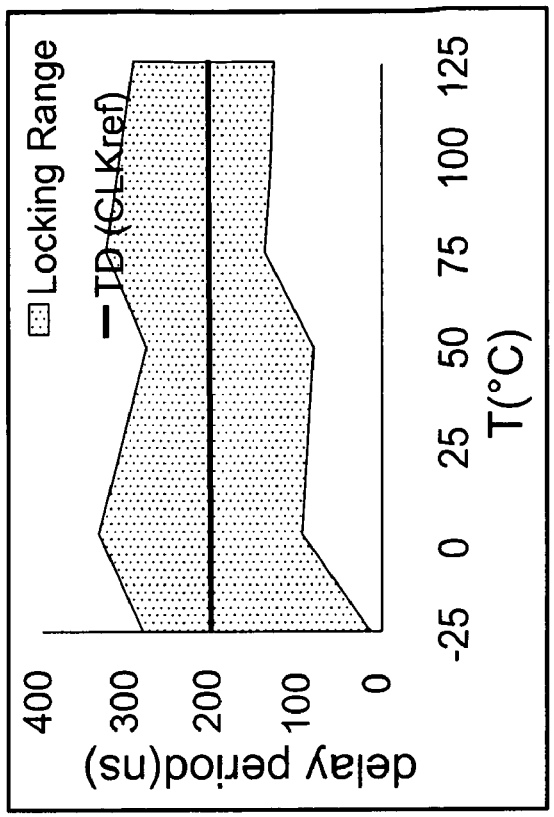
Figure 5C:
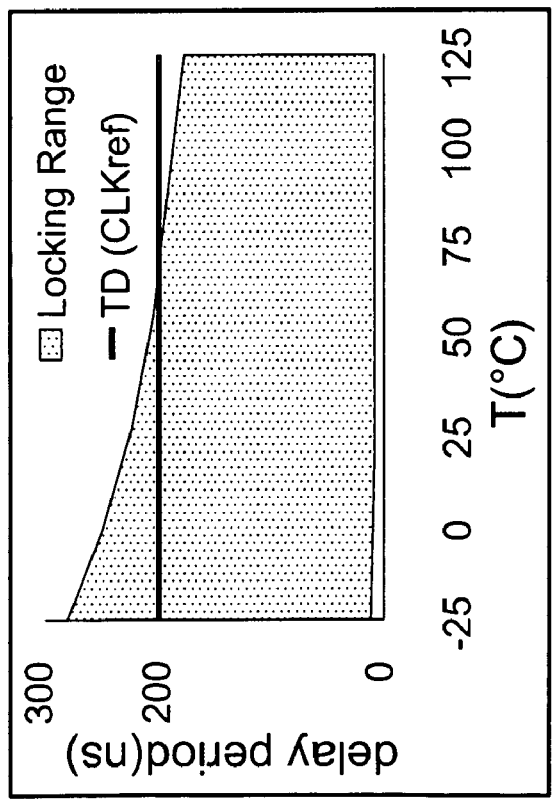
Figure 5D:
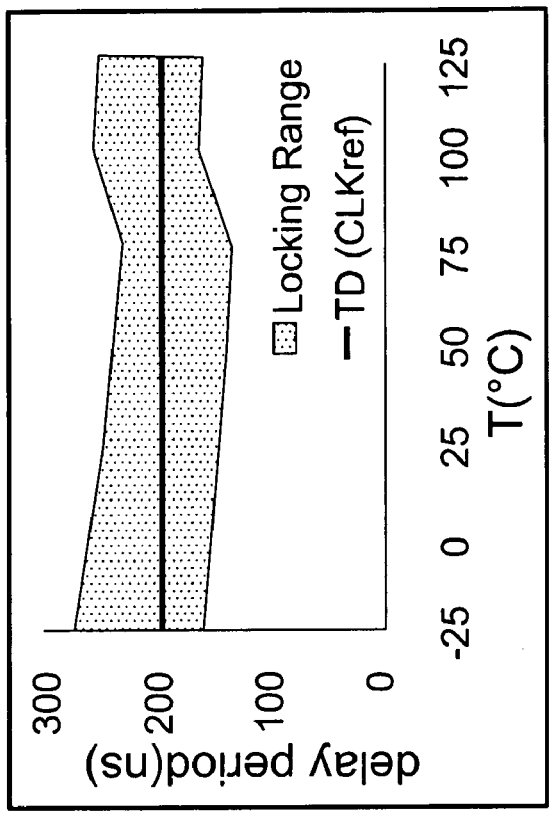
Figure 5D:
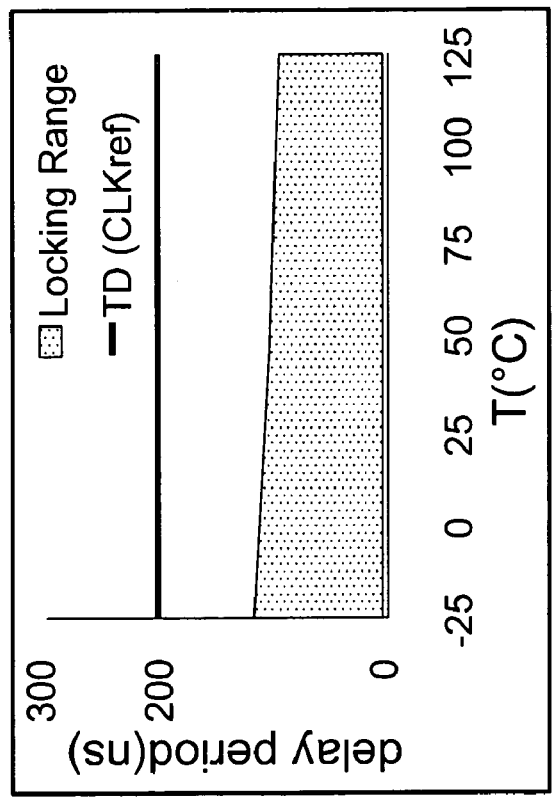

Referring to FIG. 1, FIG. 4A, and FIG. 4B, the circuit for the compensation detecting unit 1142, the compensation delay unit 1148 of a preferred embodiment of the programmable clock generator 100 provided by the invention is illustrated in FIG. 4A and FIG. 4B. In the embodiment of FIG. 4A, the compensation unit 114 includes a compensation detecting unit 1142, a second counting unit 1144, and a decoding unit 1146. It has to demonstrate that the compensation unit 114 is a process, voltage, temperature detecting circuit, which is composed of a ring oscillator for switching on or off. When the programmable clock generator 100 is in the compensation step, its switching signal will open a pulse period, and the second counting unit 1144 will record its oscillating times. Among these, the structure of lock-in delay unit 112 and compensation unit 114 is the lattice delay line, which is composed of NAND gate $D_{NAND}$.

The structure of lock-in delay unit 112 shown in FIG. 1 is the lattice delay line, which is composed of NAND gate $D_{NAND}$. The compensation detecting unit 1142 shown in FIG. 4A is composed of inverter gate $D_{INV}$.

Referring also to FIG. 4A and FIG. 4B, the compensation detecting unit 1142 is a 64stage inverter delay, and its second counting value is shown in equation (1):

$$\frac{T_D}{128 \times D_{INV}} \tag{1}$$

The relation of inverter gate $D_{INV}$ and NAND gate $D_{NAND}$ is shown in equation (2):

$$D_{NAND} = 2 \times D_{INV} \tag{2}$$

Thus, equation (3) is obtained:

$$\text{count} = \frac{T_D}{64 \times D_{NAND}} \tag{3}$$

Due to the programmable clock generator 100 adopts the circulating scheme of 8-fold output frequency f4, it will be transmitted 8 times through the lock-in delay unit 112 and the compensation unit 114. In order to lock the input signal 81, the target delay of lock-in delay unit 112 and compensation unit 114 equals to ⅛$T_D$. Thus the following equation (4) can be obtained from equation (3):

$$\frac{T_D}{8} = \text{count} \times 8 \times D_{NAND} \tag{4}$$

$$= \underbrace{(\text{count} \times 8 - 64) \times D_{NAND}}_{\text{Delay provided by PVT-comp delay line}} + \underbrace{64 \times D_{NAND}}_{\text{Delay provided by lock-in delay line}}$$

From the above-mentioned equation, it is known that the delay can be divided into two parts, which are provided by the lock-in delay unit 112 and the compensation delay unit 1148, where the locking range of the lock-in delay unit 112 is between $4 \times D_{NAND}$ to $130 \times D_{NAND}$. Among these, $64 \times D_{NAND}$ in equation (4) represents the delay of lock-in delay unit 112 is in the medium value of locking range. The other delay is provided by the compensation delay unit 1148. The delay of compensation delay unit 1148 is $32 \times D_{NAND}$. The second control signal C2 is calculated by equation (5):

$$\frac{1}{32 \times D_{NAND,FO2}} [(\text{count} \times 8 - 64) \times D_{NAND,FO2}] = \frac{\text{count}}{4} - 2 \tag{5}$$

Due to this delay is provided by the compensation delay unit 1148, its value should not be negative, and its minimum value is 0.

Referring to FIG. 5A, FIG. 5B, FIG. 5C, and FIG. 5D, the locking range of a programmable clock generator 100 of another preferred embodiment after PVT compensation at 0.2V TT, 0.2V FF, 0.5V TT and 0.5V FF is illustrated. Among these, (a) is before the compensation and (b) is after the compensation. It can be observed that in (a) of FIG. 5A to FIG. 5D, the input signal S1 and the reference pulse signal TD do not lie in the locking range, because of the influence of environmental variation, so that the programmable clock generator 100 is unable to output the multiple pulses. In (b) of FIG. 5A to FIG. 5D, the reference pulse of the input signal S1 and the reference pulse signal TD falls in the locking range after PVT compensation under multiple environmental images.

From the above-mentioned embodiment, the invention provides a unified logic model, which is created in four different CMOS nano-generations and the variation of environmental parameters, including 0.1 to 1 V of supply voltage and −50 to 125° C. of temperature. Furthermore, the maximum mean error of the model will not exceed 8.4%. Providing a temperature reinforced buffer pulse tree by using a unified logic model, in order to reduce the pulse phase difference caused by temperature. The logic will try hard to transmit the delay index to control the temperature and supply voltage through the adjustable buffer. In this design, the temperature sensor will detect the temperature of different part and adjust the logic of corresponding buffer dynamically in order to reduce the pulse phase difference.

The invention provides a Sub- and Near-Threshold programmable clock generator, which is able to generate an output pulse with ⅛ to 4 times of input frequency f1. The logic design of variation sensing has already been carried out on this pulse generator. The pulse circulating scheme adopted by the invention may reduce the oscillation of output pulse caused by the process variation. In addition, the invention realizes a process, voltage, temperature compensation unit, which is used to adjust the locking range of pulse generator.

It is understood that various other modifications will be apparent to and can be readily made by those skilled in the art without departing from the scope and spirit of the invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the invention pertains.

What is claimed is:

1. A programmable clock generator suitable to be used in dynamic-voltage-and-frequency-scaling (DVFS) operated in Sub- and Near-Threshold region, comprising:
    a first pulse generating unit means for receiving an input signal having an input frequency in order to generate a first pulse signal with a first phase and a first frequency; and
    a pulse multiplier means for connecting the first pulse generating unit, the pulse multiplier comprising:
        a phase detector connecting the first pulse generating unit and receiving the first pulse signal in order to generate a phase difference signal;
        a control unit connecting the phase detector in order to generate a first control signal and a selection signal;
        a multiplexer connecting the control unit, the first pulse generating unit, and a second pulse generating unit in order to receive the selection signal, the first pulse signal, and a second pulse signal, wherein the control unit controlling the multiplexer in accordance with the selection signal in order to transmit the first pulse signal or the second pulse signal;
        a lock-in delay unit connecting the control unit and the multiplexer, the lock-in delay unit being to delay the signals receiving by the multiplexer so that a first predetermined phase being generated between the first pulse signal and the second pulse signal;
        a compensation unit connecting the lock-in delay unit in order to compensate a second predetermined phase generated between the first pulse signal and the second pulse signal;
        the second pulse generating unit connecting the compensation unit and the phase detector in order to generate the second pulse signal having a second phase and a second frequency; and
        a first counting unit connecting the second pulse generating unit, the control unit and the phase detector, the first counting unit being calculate a first counting value, and transmitting a first counting signal to the phase detector and the control unit;
    wherein, when the first counting value calculated by the first counting unit being 8, the first counting unit generating the first counting signal to control the phase detector comparing a phase difference between the first pulse signal and the second pulse signal in order to transmit the phase difference signal to the control unit, the control unit transmitting the first control signal to the lock-in delay unit in accordance with the phase difference signal, and controlling the lock-in delay unit to adjust the phase of the second pulse signal, so that a predetermined phase being generated between the first pulse signal and the second pulse signal.

2. The programmable clock generator according to claim 1, wherein the compensation unit comprises a process, voltage, temperature compensation unit, providing the compensation of the second predetermined phase generated between the first pulse signal and the second pulse signal.

3. The programmable clock generator according to claim 1, wherein the second frequency is 8 times of the first frequency.

4. The programmable clock generator according to claim 1, wherein the compensation unit further comprising:
    a compensation detecting unit for receiving a reference pulse signal, and outputting a third pulse signal;
    a second counting unit connecting the compensation detecting unit, the second counting unit counting the third pulse signal to obtain a second counting value and generate a second counting signal; and
    a decoding unit connecting the second counting unit, the decoding unit receiving the second counting signal and decoding to generate a second control signal; and
    a compensation delay unit connecting the decoding unit, the lock-in delay unit and the second pulse generating unit, the compensation delay unit receiving the second control signal;
    wherein, the second control signal controlling the compensation delay unit in order to compensate the second predetermined phase generated between the first pulse signal and the second pulse signal so that the first pulse signal or the second pulse signal being falling in a locking range of the programmable clock generator.

5. The programmable clock generator according to claim 4, wherein the structure of lock-in delay unit is a lattice delay line and NAND gate, and the compensation detecting unit is composed of inverter gate.

6. The programmable clock generator according to claim 1, further comprising a frequency divider to connect the first pulse generating unit, the second pulse generating unit, the phase detector and the counting unit, the frequency divider comprises a first parameter and a second parameter, the frequency divider being for outputting an output signal, wherein the output signal comprising an output frequency, the first parameter comprising 1 and 8, the second parameter comprising 2, 4, 6 and 8, the output frequency being divided by the input frequency equals to the first parameter being divided by the second parameter.

7. The programmable clock generator according to claim 1, wherein the structure of lock-in delay unit and compensation unit is a lattice delay line and a NAND gate.

* * * * *